(12) United States Patent
Birtcher et al.

(10) Patent No.: US 10,480,070 B2
(45) Date of Patent: Nov. 19, 2019

(54) DELIVERY CONTAINER WITH FLOW DISTRIBUTOR

(71) Applicant: Versum Materials US, LLC, Allentown, PA (US)

(72) Inventors: Charles Michael Birtcher, Valley Center, CA (US); James Patrick Nehlsen, East Stroudsburg, PA (US); Sergei Vladimirovich Ivanov, Schnecksville, PA (US); Thomas Andrew Steidl, Escondido, CA (US); Kai Kang, Allentown, PA (US); Wade Hampton Bailey, III, Emmaus, PA (US)

(73) Assignee: VERSUM MATERIALS US, LLC, Tempe, AZ (US)

(*) Notice: Subject to any disclaimer, the term of this patent is extended or adjusted under 35 U.S.C. 154(b) by 61 days.

(21) Appl. No.: 15/587,095

(22) Filed: May 4, 2017

(65) Prior Publication Data

US 2017/0327945 A1 Nov. 16, 2017

Related U.S. Application Data

(60) Provisional application No. 62/335,396, filed on May 12, 2016.

(51) Int. Cl.
| | | |
|---|---|---|
| *C23C 16/44* | (2006.01) |
| *C23C 16/448* | (2006.01) |
| *B01B 1/00* | (2006.01) |
| *B01D 1/14* | (2006.01) |
| *B01J 4/00* | (2006.01) |

(52) U.S. Cl.
CPC .......... *C23C 16/4481* (2013.01); *B01B 1/005* (2013.01); *B01D 1/14* (2013.01); *B01J 4/002* (2013.01); *B01J 4/004* (2013.01); *C23C 16/4482* (2013.01)

(58) Field of Classification Search
CPC . C23C 16/4482; C23C 16/4481; B01B 1/005; B01J 4/002; B01J 4/004; B01D 1/14
See application file for complete search history.

(56) References Cited

U.S. PATENT DOCUMENTS

| | | | |
|---|---|---|---|
| 4,844,949 A * | 7/1989 | Arai ........................ | C23C 16/32 427/213 |
| 4,861,524 A * | 8/1989 | Sielaff ............... | C03B 37/01413 261/130 |

(Continued)

FOREIGN PATENT DOCUMENTS

| | | |
|---|---|---|
| JP | 63014856 A | 1/1988 |
| JP | 2001059178 A | 3/2001 |

(Continued)

*Primary Examiner* — Stephen Hobson
(74) *Attorney, Agent, or Firm* — Lina Yang (57) ABSTRACT

Described herein are delivery containers, systems and methods using same for providing improvements to precursor utilization in the containers for deposition process, as well as the cleaning and refilling of the containers. The containers are designed with structures which allow a carrier gas to be delivered from a flow distributor. The flow distributor comprises a plurality of small openings (jets) through which the carrier gas enters the precursor chamber and impinges upon the surface of the chemical precursors to produce a vapor.

15 Claims, 4 Drawing Sheets

(56) References Cited

U.S. PATENT DOCUMENTS

| | | | | |
|---|---|---|---|---|
| 5,078,922 A * | 1/1992 | Collins | B01F 3/022 261/124 |
| 5,443,662 A * | 8/1995 | Arai | C23C 16/442 148/209 |
| 5,520,858 A * | 5/1996 | Yamaguchi | B01D 1/0076 261/122.1 |
| 6,033,479 A * | 3/2000 | Ikeda | B08B 9/032 118/688 |
| 6,270,839 B1 * | 8/2001 | Onoe | C23C 16/4481 118/726 |
| 6,561,498 B2 * | 5/2003 | Tompkins | B01F 3/04007 261/124 |
| 6,698,728 B1 * | 3/2004 | Ravetz | C23C 16/4482 261/121.1 |
| 8,313,804 B2 * | 11/2012 | Carlson | C23C 16/4482 427/237 |
| 9,957,612 B2 * | 5/2018 | Woelk | B01J 4/004 |
| 2003/0235389 A1 * | 12/2003 | Kang | C23C 16/4482 385/147 |
| 2008/0251016 A1 * | 10/2008 | Cunning | C23C 16/4481 118/722 |
| 2012/0042838 A1 * | 2/2012 | Ieki | B01B 1/02 122/28 |
| 2015/0276264 A1 * | 10/2015 | Lind | C23C 16/4482 122/459 |

FOREIGN PATENT DOCUMENTS

| | | |
|---|---|---|
| JP | 2009526134 A | 7/2009 |
| JP | 2012251179 A | 12/2012 |
| JP | 2013509736 A | 3/2013 |
| JP | 2014012888 A | 1/2014 |
| WO | 2017115147 A2 | 7/2017 |

* cited by examiner

DELIVERY CONTAINER WITH FLOW DISTRIBUTOR

CROSS REFERENCE TO RELATED PATENT APPLICATIONS

The present patent application claims the benefit of U.S. Provisional Patent Application Ser. No. 62/335,396 filed May 12, 2016.

BACKGROUND

The electronic device fabrication industry requires various chemicals as raw materials or precursors to fabricate integrated circuits and other electronic devices. Deposition processes such as, chemical vapor deposition (CVD) and atomic layer deposition (ALD) processes, are used in one or more steps during the manufacture of a semiconductor device to form one or more films or coatings on the surface of a substrate. In a typical CVD or ALD process, a precursor source that may be in a solid and/or liquid phase is conveyed to a reaction chamber having one of more substrates contained therein where the precursor reacts under certain conditions such as temperature or pressure to form the coating or film on the substrate surface.

There are several accepted technologies to supply a precursor vapor to a processing chamber. One process supplies the liquid precursor to a processing chamber in a liquid form with the flow rate controlled by a liquid mass flow controller (LMFC) and then the precursor is evaporated by a vaporizer at the point of use. A second process involves a liquid precursor being evaporated by heating and the resulting vapor is supplied to a chamber with the flow rate controlled by a mass flow controller (MFC). A third process involves bubbling a carrier gas upwardly through the liquid precursor. A fourth process involves enabling the carrier gas to flow over the surface of the precursor contained in a canister and carrying precursor vapor out of the canister and subsequently to the process tool.

Described herein are containers, systems and methods using same for delivering high purity process chemical precursors to a process tool that is used in the manufacture of a semiconductor device. More specifically, described herein are systems comprising a container (a vessel or an ampoule) with flow distributor, such as multiple small holes or jets; and chemical precursors for a process tool such as a deposition reactor in a chemical vapor deposition (CVD) or atomic layer deposition (ALD) process.

The delivery of chemical vapor from a solid precursor by sublimation, is one of the subject matters of the present invention One challenge associated with conventional containers that deliver chemical vapor from a solid precursor by sublimation is difficulty in obtaining high utilization of precursor. It is difficult to minimize the amount of precursor left in the container when it is taken out of service to be cleaned and refilled. One cause of this problem is that, in conventional solid source containers, the distance between the surface of the precursor and the inlet and outlets used to circulate the carrier gas, as well as the volume of the area in which the carrier gas contacts the precursor vapor, increases as the precursor is exhausted.

Attempts have been made to increase precursor utilization, including more uniform heating of the precursor chamber and improved carrier gas circulation. Although these efforts have resulted in improvements in precursor utilization, the structures needed to implement these improvements can make the containers more difficult to clean and there is a need for further improvement in the precursor utilization.

Some prior arts provide the designs where the inlet tube is positioned above the precursor surface but don't provide sufficient momentum for carrier gas to perturb the surface of the precursor at low container fill level or at low load level. Thus, precursor delivery rate for prior art designs is typically significantly lower at low container fill level (or at low load level) compare to precursor delivery rate at high container fill level (or at high load level).

Some prior arts also provide the designs where the inlet tube positioned below the precursor surface. Precursors (liquid or solid) are supplied in bubblers. Wherein in use, a carrier gas is bubbled through and becomes saturated with the precursor via a dip pipe, as disclosed in U.S. Pat. Nos. 8,313,804 B, 2, 6,698,728 and 6,033,479 A.

However, these designs often present problems for delivery of solid precursors due to plugging inlet with solids, non-uniform delivery rate due to carrier gas channeling around the solids, and delivery rate variation during container utilization.

Thus, there is a need in the art for a system and a method for delivery of precursors to a deposition or process site that aiming to overcome the abovementioned drawbacks.

SUMMARY

It is an object of the present invention to provide containers, systems and methods for delivering chemical precursors to a deposition or processing site and to overcome the abovementioned drawbacks. The sublimation rate of the precursor is reduced <25%, preferably <5%, more preferably <3%, or is even increased when precursor load level reduces in the container.

On one aspect, the invention is a container for delivering a chemical precursor to a process tool, comprising:
  a sidewall;
  a base,
  a lid having a flat surface,
  an inlet tube,
  a flow distributor comprising a plurality of small openings as jets, and
  an outlet passing through the lid;
  wherein
  the inlet tube passes through the lid and extended into the flow distributor, and is in fluid communication with the flow distributor,
  the jets are facing the base at an angle ranging from 60 to 90 degrees to the lid, and
  each jet has an equivalent diameter ranging from 0.01 inches (0.025 cm) to 0.25 inches (0.64 cm).

In another aspect, the invention is a system for delivering a chemical precursor to a process tool, comprising:
  the chemical precursor selected from the group consisting of metal halides, metal β-diketonates, metal β-diketoesterates, metal β-ketoiminates, metal β-diiminates, metal alkyls, metal carbonyls, alkyl metal carbonyls, metal cyclopentadienyls, metal cyclopentadienyls carbonyls, metal pyrrolyls, metal imidazolyls, metal amidinates, metal alkoxides, and combinations thereof;
  wherein
    ligand is selected from the group consisting of monodentate, bidentate and multidentate complexing to the metal atoms, and the metal is selected from the group consisting of Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te, Cr, Mo, Ta, and W;

a container containing the chemical precursor; comprising:
sidewall,
a base,
a lid having a flat surface,
an inlet tube,
a flow distributor comprising a plurality of small openings as jets, and
an outlet passing through the lid;
wherein
the inlet tube passes through the lid and extended into the flow distributor, and is in fluid communication with the flow distributor,
the jets are facing the base at an angle ranging from 60 to 90 degrees to the lid,
tip of each jet is located with a distance of greater or equal to 0.5 inches from the chemical precursor the jet is facing, and
each jet has an equivalent diameter ranging from 0.01 inches (0.025 cm) to 0.25 inches (0.64 cm).

In yet another aspect, the invention is a method for delivering a chemical precursor to a process tool, comprising:
providing the chemical precursor selected from the group consisting of metal halides, metal β-diketonates, metal β-diketoesterates, metal β-ketoiminates, metal β-diiminates, metal alkyls, metal carbonyls, alkyl metal carbonyls, metal cyclopentadienyls, metal cyclopentadienyls carbonyls, metal pyrrolyls, metal imidazolyls, metal amidinates, metal alkoxides, and combinations thereof;
wherein
ligand is selected from the group consisting of monodentate, bidentate and multidentate complexing to the metal atoms, and
the metal is selected from the group consisting of Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te, Cr, Mo, Ta, and W;
providing a container containing the chemical precursor comprising
sidewall,
a base,
a lid having a flat surface,
an inlet tube,
a flow distributor comprising a plurality of small openings as jets, and
an outlet passing through the lid;
wherein
the inlet tube passes through the lid and extended into the flow distributor, and is in fluid communication with the flow distributor,
the jets are facing the base at an angle ranging from 60 to 90 degrees to the lid,
tip of each jet is located with a distance of greater or equal to 0.5 inches from the chemical precursor the jet is facing, and
each jet has an equivalent diameter ranging from 0.01 inches (0.025 cm) to 0.25 inches (0.64 cm);
passing a carrier gas through the jets and impinging upon the surface of the chemical precursor to produce a vapor or droplets of the chemical precursor mixing with the carrier gas to form a precursor-laden fluid stream; and
passing the precursor-laden fluid stream through the outlet of the container to the process tool;
wherein the sublimation rate is reduced <25%, preferably <10%, more preferably <5%, and most preferably <3%, or is increased when precursor load level reduces in the container from an initial fill height to 20% of the initial fill height.

The container can have any shape. The shape includes but is not limited to cylindrical, rectangular cuboid, right cuboid, rectangular box, rectangular hexahedron, right rectangular prism, or rectangular parallelepiped; and with a cross section of circle, oval, square, rectangle or any other shape used in the art.

The flow distributor can have any cross section shape. The shape includes but is not limited to tubular, circular, square, rectangular, the combinations thereof, or any other shape used in the art.

The flow distributor can comprise one or more hollow members extending parallel to the lid and being in fluid communication with the inlet tube. Each hollow member of the flow distributor has a plurality of small openings as jets located on the bottom part of the flow distributor at an angle ranging from 60 to 90 degrees to the container lid.

The flow distributor can have 2 to 16 pipes or hollow bars crossed at a common center and extended from the common center parallel to the lid and being in fluid communication with inlet tube. Preferably each pipe or hollow bar is sealed on the sides and only have a plurality of small openings as jets pointed toward the precursor. The flow distributor can be a hollow cross. Each hollow bar can have any cross section shape including but is not limited to square. Each pipe or hollow bar can have inner equivalent diameter ranging from ⅛" to 1".

The flow distributor can also have a showerhead shape with any cross section shape including but is not limited to tubular, circular, square, rectangular, or any other shape used in the art.

The showerhead has an area parallel to the lid ranging from 5% to 90%, preferably from 30% to 90%, and more preferably from 60% to 90% of the area of the container parallel to the lid.

Each jet in the flow distributor can have a diameter ranging from 0.01 inches (0.025 cm) to 0.25 inches (0.64 cm), preferably from 0.01 inches (0.025 cm), to 0.05 inches (0.125 cm).

BRIEF DESCRIPTION OF THE DRAWINGS

The present invention will hereinafter be described in conjunction with the appended figures wherein like numerals denote like elements.

DETAILED DESCRIPTION

One challenge associated with conventional vessels that deliver chemical vapor from a solid precursor by sublimation is the difficulty in obtaining high utilization of precursor. It is difficult to minimize the amount of precursor left in the vessel when it is taken out of service to be cleaned and refilled.

In order to aid in describing the invention, some terms are defined and used in the specification.

The term "conduit", may be used in the specification and claims, refers to one or more structures through which fluids can be transported between two or more components of a system. For example, conduits can include pipes, ducts, passageways, and combinations thereof that transport liquids, vapors, and/or gases.

The term "flow communication," as used in the specification and claims, refers to the nature of connectivity between two or more components that enables liquids, vapors, and/or gases to be transported between the components in a controlled fashion (i.e., without leakage). Coupling two or more components such that they are in flow communication with each other can involve any suitable method known in the art, such as with the use of welds, flanged conduits, gaskets, and bolts.

The term "jet" includes an opening in the flow distributor from which fluid exits the flow distributor after entering through the inlet tube. The term "showerhead" includes a single internal hollow volume (e.g. of circular cylindrical shape) in fluid communication with more than two jet openings arranged in a non co-linear arrangement, for example in a circle, in concentric circles, in radial lines, in a hexagonal pattern, or any other symmetrical or non-symmetrical arrangement. The term "angle of the jet" includes the angle of a line through the midpoint of the jet opening normal to the plane of the surface defining the jet opening. The term "when precursor load level reduces in the container" includes reduction of the precursor load level from an initial fill height to 20% of the initial fill height. The term "sublimation" includes vaporization of solid precursor and also vaporization of liquid precursor (also referred to herein as "evaporation").

The term "Reynolds number" is a dimensionless quantity used in fluid mechanics known in the art. The Reynolds number is defined as the mathematical product of the velocity of the fluid, the equivalent diameter of the pipe that the fluid is passing, and the density of the fluid, divided by the dynamic viscosity of the fluid. For flow in a cylindrical pipe, the internal diameter is generally used as the equivalent diameter. Other shapes such as rectangular pipes or non-cylindrical pipes the equivalent diameter is defined as $D_E=4A/P$, where A is the cross sectional area and P is the perimeter of the cross-section. For flow through a hole or orifice, the equivalent diameter of the hole or orifice and the average velocity of the fluid as it passes through the hole or orifice are used.

Some directional terms may be used in the specification and claims to describe portions of the present invention (e.g., upper, lower, left, right, etc.). These directional terms are merely intended to assist in describing and claiming the invention, and are not intended to limit the invention in any way.

The present invention comprises improvements to precursor utilization in vessels used to deliver a precursor-containing fluid stream to a deposition process, as well as simplifying the cleaning and refilling of such vessels. The sublimation rate of the precursor is reduced <5% or is even increased when precursor load level reduces in the container.

More specifically, described herein are systems and methods that are used to provide one or more process chemicals to a process tool designed for manufacturing semiconductors, and to allow the process chemical to be easily and efficiently cleaned from the process chemical container or ampoule as well as other associated components in the delivery system.

The disclosed embodiments satisfy the need in the art by providing the structure that allows a carrier gas to be delivered from the inlet tube to the flow contributor positioned above the precursor surface such that the jet of the carrier gas delivered from the inlet tube has sufficient momentum to perturb the surface of the precursor.

In one aspect, the containers that are used to deliver chemical precursor can have any shapes, including but are not limited to cylindrical, rectangular cuboid, right cuboid, rectangular box, rectangular hexahedron, right rectangular prism, or rectangular parallelepiped; and with a cross section of circle, oval, square, rectangle or any other shape used in the art. The volume of the containers to the process tool ranges from 100 milliliters (ml) to 10 liters. Alternative names for the containers described herein include "Ampoules", "Vessels", "Source Containers", "Hosts" and other proprietary names. The containers described herein may further include a means for initially filling and cleaning the reservoir.

In certain embodiment, the containers have a large cap, lid, or bung that is fastened such as by screws or other means onto the top of the reservoir and sealed with elastomeric or metal o-rings and/or gaskets. This lid frequently has a flat surface that is used for the installation of level sense probes, including float, ultrasonic, differential pressure, thermal and other styles of immersible level senses. They typically are mounted in process tools or OEM tools for use in delivering small amounts of chemical precursor to the process tool. In a direct liquid injection (DLI) process, the exact flow rate may be limited by pressure, therefore requiring that inlet pressures be tightly controlled. Often these ampoules are kept in small temperature controlling units to maintain variables like vapor pressure, viscosity and precursor reactivity.

The material of construction of the vessels is typically stainless steel, but may be made from other materials depending on the reactivity of the precursor with the material in question. The materials of construction of the apparatus described herein exhibit one or more of the following characteristics: chemically compatible to prevent corrosion or reaction with the precursor, strong enough to support the pressures and vacuum forces used, and generally leak tight to hold vacuum from 1 mTorr to 500 mTorr depending on the process chemicals and/or solvent in use. The containers also contain one or a plurality of valves and ports and sensors, to allow access to the precursor.

In certain embodiments, one or more of the container(s) contain a level sense system, which may be disposed within or outside the container. In embodiments, wherein the level sense system is disposed within the container, the level sensing function is performed using ultrasonic level sensors or, alternatively, float probes. Other level sense techniques include, but are not limited to, thermally based level sense, differential pressure, both discrete and continuous ultrasonic level sense, capacitive, optical and microwave impulse radar level senses, and/or combinations thereof. The level sense may also be disposed outside of the reservoir. These level sense types include ultrasonic, scales/load cells, thermal, X-ray/radiation, and similar techniques. These techniques have the advantage of having no penetration into the reservoir interior, even though the accuracy of the measurement may not be quite as accurate. Ultrasonic empty sensing can be done using an ultrasonic sensor attached, clamped-on, or embedded to the delivery line, permitting the refill system to precisely gauge when no more chemical is left in the replaceable bulk tank, allowing the end-user customer to consume the majority of process chemical.

The container(s) can further contain a separate penetration (such as an inlet tube) for inert gas to flow into the container. In certain embodiments, the chemical flows, at least initially, due to differential pressure between the inlet side of the container and the pressure at the outlet of the container. After that, pumps or other means may occasionally be used to deliver the chemical to where it is needed. This penetration usually takes the form of a small tube welded to the top of the container, which is then attached to a valve (either manual or automatic) that controls the influx of the inert gas into the container. The flow direction of the inert gas line penetration is not defined, and can be used for multiple functions, for example, venting of excess pressure from the interior of the vessel, or refilling from a separate vessel (by itself for further incorporating a third port for that function). The inert gas line may be attached to a baffle in the interior of the container, which is used to prevent the splattering of process chemical into the inert gas delivery system or into the vent system during a venting operation. Such a baffle can consist of right angled tubing, a "tee" fitting, a screen/mesh assembly, or a filter, including metal, ceramic or plastic filters all available on the open market. Typically, the space above the precursor level is called the headspace, so this port is usually called a headspace port.

To avoid the formation of aerosols and to avoid plugging the inlet tube with solids, described herein is an apparatus that achieves carrier gas saturation without using an inlet tube submerged below the surface of the precursor. Rather than injecting the carrier gas below the surface of the chemical precursor, the carrier gas is instead injected in the head space above the surface of the precursor.

In one embodiment the inlet tube is extended into a flow distributor. The flow distributor can have any cross section shape, including but is not limited to tubular, square, rectangular or any other shape used in the art. The flow distributor comprises one or more hollow members (such as bars, pipes) extending parallel to the lid surface and being in fluid communication with inlet tube pipe. Each hollow member of the flow distributor has more than two or a plurality of small openings as jets located on the bottom part of the hollow member at an angle ranging from 60 to 90 degrees to the container lid surface. Preferably, the jet openings are evenly distributed, e.g. in radial lines, and the flow distributor is configured to allow for this (e.g. by having radially arranged bars and/or a circular cylindrical showerhead).

Figure 1:
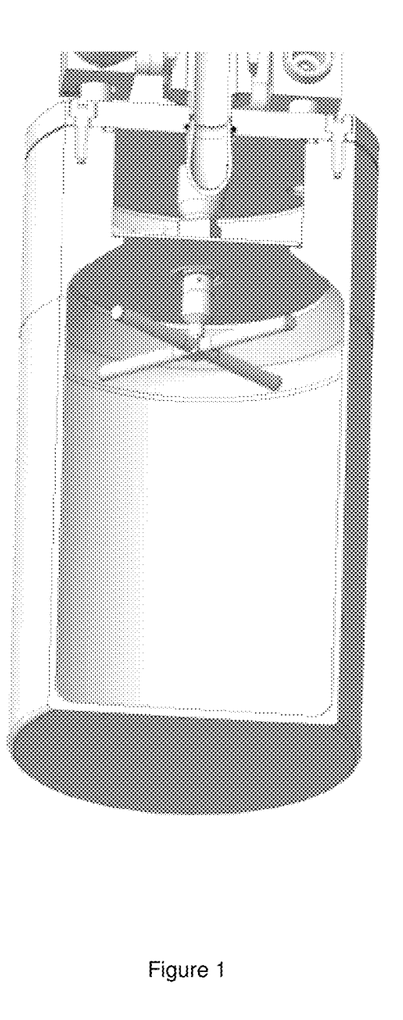
FIG. 1 provides a side cross section view of a container having an inlet tube extended into a hollow cross shape flow distributor.
Figure 2:
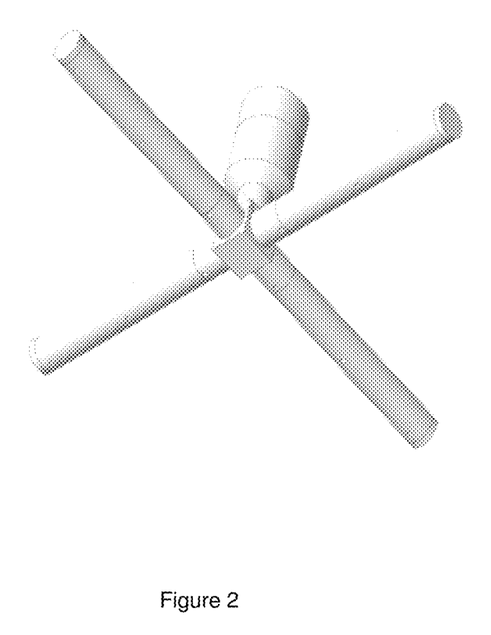
FIG. 2 provides an inlet tube extended into a hollow cross shape flow distributor.

The flow distributor can have two to 16 pipes or hollow bars evenly extending parallel to the lid surface and being in fluid communication with inlet tube pipe. Preferably each pipe or hollow bar is sealed on the sides and only have a plurality of small openings as jets pointed toward the precursor. Each hollow bar can have any cross section shape including but is not limited to a square. Each pipe or hollow bar can have a diameter ranging from ⅛" to 1". The flow distributor can be a hollow cross. One example of this design is shown in FIGS. 1 and 2.

Each jet in the flow distributor can have a diameter ranging from 0.01 inches (0.025 cm) to 0.25 inches (0.64 cm), preferably from 0.01 inches (0.025 cm), to 0.05 inches (0.125 cm).

The flow distributor can also have a showerhead shape with any cross section shape including but is not limited to but is not limited to the same shape as the shape of the cross section of the container, for example tubular, circular, square, rectangular, or any other shape used in the art. The showerhead can have an area parallel to the lid surface ranging from 5% to 90%, preferably from 30% to 90%, and more preferably from 60% to 90% of the area of the container parallel to the lid surface. The height of the showerhead is about ⅛' to 1", preferably ¼" to ½" Inches.

Figure 3:
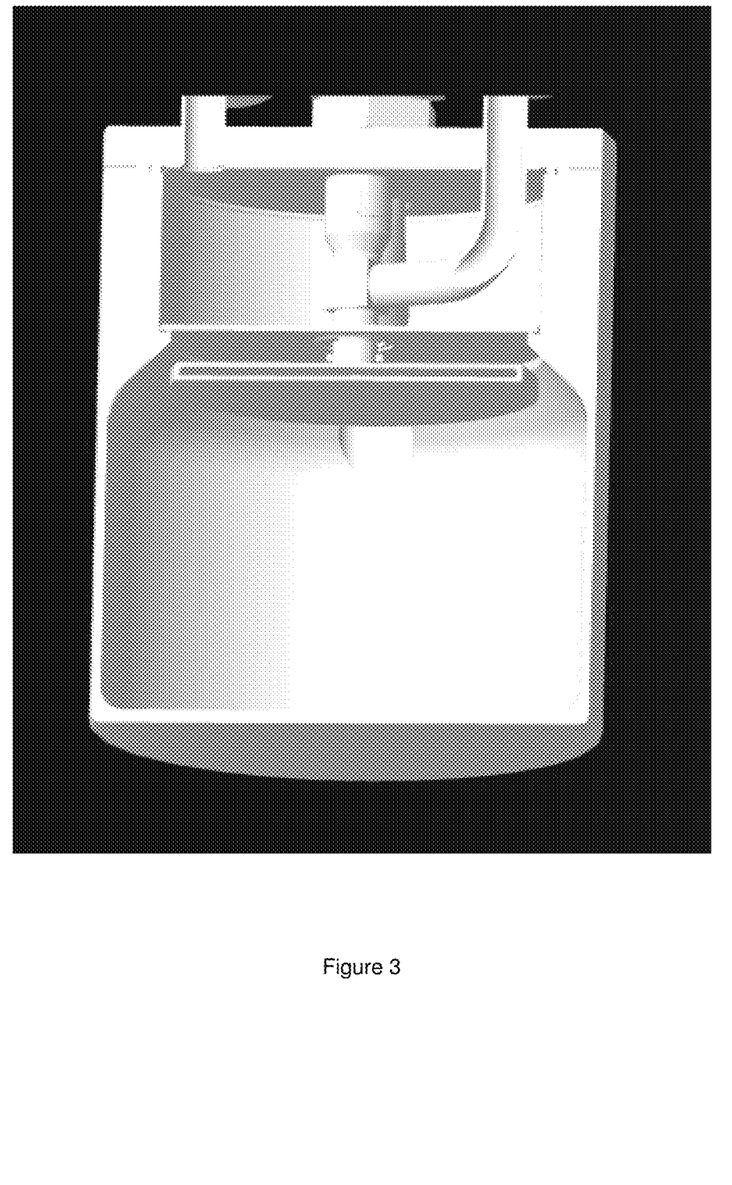
FIG. 3 provides a side cross section view of a container having an inlet tube extended into a showerhead shape flow distributor.

One example of this showerhead shaped flow distributor design is shown in FIG. 3.

Figure 4:
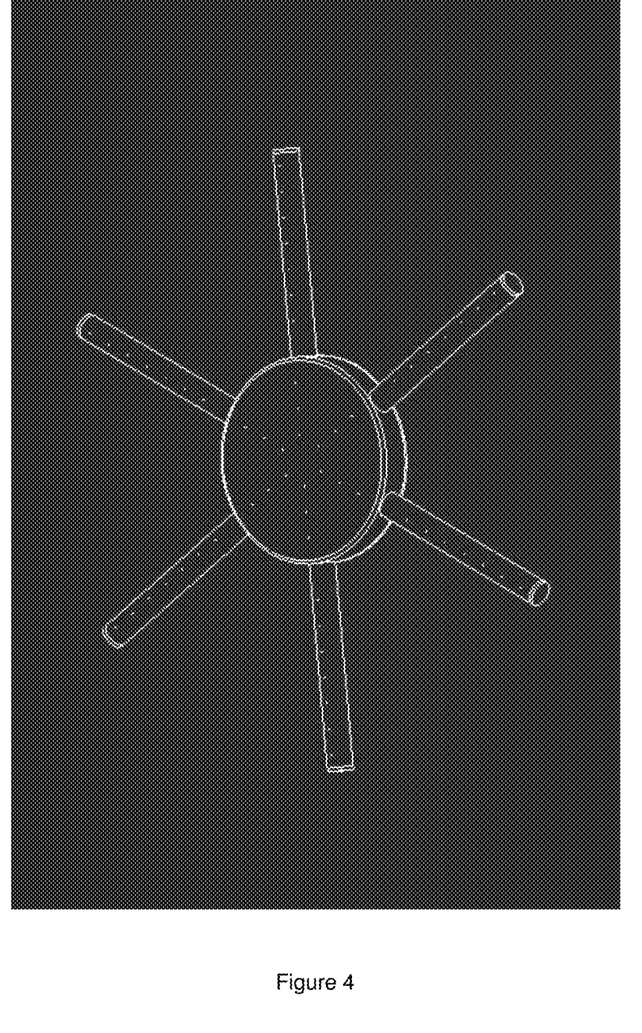
FIG. 4 provides an inlet tube extended into a mixture of a hollow cross shape and showerhead shape flow distributor.

The flow distributor can be in a shape of any combinations of the showerhead shapes with two to 16 pipes or hollow bars evenly extending from the edge of the showerhead and being in fluid communication with the showerhead. One example of the design is shown in FIG. 4.

The flow distributor can also be in the shape of one or more hollow rings, or can be hollow concentric rings.

Each hollow member of the flow distributor comprises a plurality of small openings or perforations located in the bottom portion of the hollow members as nozzles or jets. The carrier gas flows through the jets and enters the precursor chamber. Each flow distributor has from ~2 to 60, preferably 6 to 33 jets. Each jet in the flow distributor can have a diameter ranging from 0.01 inches (0.025 cm) to 0.25 inches (0.64 cm), preferably from 0.01 inches (0.025 cm), to 0.05 inches (0.125 cm).

More specifically, each jet is directed vertically downward at an angle ranging from 60° to 90° to the container lid. As a result, the carrier gas impinges upon the surface of the chemical precursor, thereby reducing the mass transport limitations that occur in other designs where the carrier gas is not directed onto the surface. The jets are designed such that they have sufficient momentum to perturb the surface of the precursor regardless of the precursor height in the container, but yet they have insufficient momentum to generate significant splashing or dusting at the site of impingement.

To impinge on the surface of the precursor, each jet is preferably designed to achieve a Reynolds number greater than 50, and more preferably greater than 150, for the carrier gas. The Reynolds number is defined as the mathematical product of the nozzle inner diameter, the actual gas velocity in the jet tip, and density of the carrier gas, divided by the dynamic viscosity of the carrier gas. When determining these physical properties, the temperature and pressure inside the container headspace are used as the basis. The jets are also designed in a way to achieve as uniform as possible impingement of the carrier gas on the precursor surface.

FIGS. 1 to 4 provide examples of embodiments of present invention.

As shown in FIGS. 1 and 3, a container has an interior volume defined by the container base, container sidewall, and lid to house the precursor to be delivered. The surface of the precursor, sidewall and interior surface of the lid define the vapor space or headspace which varies with the fill level of precursor to be delivered. The container also has a carrier gas inlet valve which is in fluid communication with the interior volume and head space of container.

In FIG. 1, the carrier gas inlet tube is extended into a cross or crossbar shape flow distributor with 12 jets located on the bottom of the flow distributor, as shown in FIG. 2.

In FIG. 3, the carrier gas inlet tube is extended into a showerhead shape flow distributor with jets located on the bottom of the flow distributor.

In operation, a carrier gas such as, without limitation, an inert gas (e.g., helium, neon, argon, krypton, and xenon), nitrogen, or combination thereof, is introduced through carrier gas inlet tube through carrier gas jets.

The process precursor can be selected from at least one metal complex selected from the group consisting of metal halides, metal β-diketonates, metal β-diketoesterate, metal β-ketoiminates, metal β-diiminates, metal alkyls, metal carbonyl, alkyl metal carbonyl, metal cyclopentadienyls, metal cyclopentadienyls carbonyls, metal pyrrolyls, metal imidazolyls, metal amidinates, and metal alkoxides, wherein the ligand can be monodentate, bidentate and multidentate, complexing to the metal atoms, and the metal is selected from Group 2 to 15 elements of the Periodic Table of the Elements including but not limited to Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te, Cr, Mo, Ta, and W.

Exemplary process chemicals that can be used with the apparatus, method, and system described herein include, but are not limited to, tungsten hexachloride, tungsten pentachloride, tantalum pentachloride, molybdenum pentachloride, hafnium tetrachloride, zirconium tetrachloride, dicobalt hexacarbonyl tert-butylacetylene (CCTBA), dicobalt hexacarbonyl dialkylacetylene (R'CCR") Co2(CO)6), cyclopentadienylcobalt dicarbonyl, alkylcyclopentadienyl cobalt dicarbonyl, cobalt tricarbonyl nitrosyl (Co(CO)3(NO)), (tert-butylallyl)cobalt tricarbonyl (tBuAllyl)Co(CO)3, cyclopentadienylmanganese tricarbonyl (CpMn(CO)3), alkylcyclopentadienylmanganese tricarbonyl (e.g. MeCpMn (CO)3, EtCpMn(CO)3), 3-(t-BuAllyl)Mn(CO)4, cyclopentadienyltungsten tricarbonyl hydride (CpW(CO)3H)), alkylcyclopentadienyl tricarbonyl hydride ((RCp)W(CO)3H), tris(carbonyl)(alkylcyclopentadienyl)methyl tungsten ((RCp)W(CO)3Me), tris(carbonyl)(alkylcyclopentadienyl) ethyl tungsten ((RCp)W(CO)3Et), alkylcyclopentadienylbis (nitrosyl)hydridotungsten ((RCp)W(NO)2)H), alkylcyclopentadienylbis(nitrosyl)methyltungsten ((RCp)W(NO2) Me), alkylcyclopentadienylbis(nitrosyl)ethyltungsten ((RCp)W(NO2)Et), bis(isopropylcyclopentadienyl) tungsten dihydride (iPrCp)2WH2, bis(alkylcyclopentadienyl) tungsten dihydride (RCp)WH2, Ni(II)N,N'-di-tertiary-butylamidinate (Ni(II)(tBu-AMD)2), Ni(II)N,N'-di-isopropylamidinate(Ni(II)(iPr-AMD)2), Ni(II)N,N'-di-ethylamidinate (Ni(II)(Et-AMD)2), Ni(II)N,N'-di-methylamidinate(Ni(II) (Me-AMD)2), Co(II)N,N'-di-tertiary-butylamidinate(Co(II) (tBu-AMD)2), Co(II)N,N'-di-isopropylamidinate(Co(II) (iPr-AMD)2), Co(II)N,N'-di-ethylamidinate(Co(II)(Et-AMD)2), Co(II)N,N'-di-methylamidinate(Co(II)(Me-AMD) 2), titanium tetrachloride (TiCl4), tetrakis(dimethylamido) titanium (TDMAT), tetrakis(diethylamido)titanium (TDEAT), tetrakis(ethylmethylamido)titanium (TEMAT), bis(ethylcyclopentadienyl)ruthenium((EtCp)2Ru), bis(dimethylpentadienyl)ruthenium, bis(diethylpentadienyl)ruthenium, RuO4, tetrakis(dimethylamido)hafnium (TDMAH), tetrakis(diethylamido)hafnium (TDEAH), tetrakis(ethylmethylamido)hafnium (TEMAH), tetrakis(dimethylamido)zirconuim (TDMAZ), tetrakis(diethylamido)zirconium (TDEAZ), tetrakis(ethylmethylamido)zirconium (TEMAZ), cyclopentadienyl-tris(dimethylamino)hafnium, methylcyclopentadienyl-tris(dimethylamino)hafnium, ethylcyclopentadienyl-tris(dimethylamino)hafnium, cyclopentadienyl-tris (dimethylamino)zirconium, methylcyclopentadienyl-tris (dimethylamino)zirconium, ethylcyclopentadienyl-tris (dimethylamino)zirconium, tert-butylimido-tris (dimethylamino)tantalum (TBTDMAT), tert-butylimino-tris (diethylamino)tantalum (TBTDET), tert-butylimido-tris (methylamino)tantalum (TBTEMT), tert-amylimido-tris(dimethylamino)tantalum (TAIMAT), ethylimino tri (diethylamino)tantalum (EITDET), ethylimino tri (dimethylamino)tantalum (EITDMT), ethylimino tri (ethylmethylamino)tantalum (EITEMT), pentakis (dimethylamino)tantalum, bis(tert-butylimino)bis (dimethylamino)tungsten (BTBMW), bis(tert-butylimino) bis(diethylamino)tungsten, bis(tert-butylimino)bis (ethylmethylamino)tungsten, bis(2,2,6,6-tetramethyl-3,5-heptanedionato)strontium, bis(2,2,6,6-tetramethyl-3,5-heptanedionato)barium, M(RnC5H5 n)2, wherein n=1-5, R is selected from linear or branched C1-6 alkyls; M(RnC4NH4-n)2, wherein n=2-4, R is selected from linear or branched C1-6 alkyls, and M(RnN2H3-n)2, where n=2-3, R is selected from linear or branched C1-6 alkyls, tantalum pentaethoxide (TAETO), copper perfluoroacetylacetonate-trimethylvinylsilane and associated metallorganic copper, titanium, or tantalum compounds. Other materials, such as cobalt, barium, strontium, titanate mixtures (BST) and PZLT precursors, as well as low-k dielectric precursors are also specified and are compatible with the apparatus, system, and method described herein.

Preferably, the process chemicals are selected from the group consisting of tungsten hexachloride, tungsten pentachloride, tantalum pentachloride, molybdenum pentachloride, hafnium tetrachloride, zirconium tetrachloride, dicobalt hexacarbonyl tert-butylacetylene (CCTBA), cyclopentadienyltungsten tricarbonyl hydride (CpW(CO)$_3$H)), bis(isopropylcyclopentadienyl) tungsten dihydride (iPrCp)$_2$WH$_2$, bis(alkylcyclopentadienyl) tungsten dihydride (RCp)WH$_2$, Ni(II)N,N'-di-tertiary-butylamidinate (Ni(II)(tBu-AMD)$_2$), Ni(II)N,N'-di-isopropylamidinate(Ni(II)(iPr-AMD)$_2$), Ni(II)N,N'-di-ethylamidinate(Ni (II)(Et-AMD)$_2$), Ni(II)N,N'-di-methylamidinate(Ni(II)(Me-AMD)$_2$), Co(II)N,N'-di-tertiary-butylamidinate(Co(II)(tBu-AMD)$_2$), Co(II)N,N'-di-isopropylamidinate(Co(II)(iPr-AMD)$_2$), tetrakis(dimethylamido)hafnium (TDMAH), tert-butylimino-tris(diethylamino)tantalum (TBTDET), tert-butylimido-tris(methylethylamino)tantalum (TBTEMT), pentakis(dimethylamino)tantalum, bis(tert-butylimino)bis (dimethylamino)tungsten (BTBMW), bis(tert-butylimino) bis(diethylamino)tungsten, bis(tert-butylimino)bis(ethylmethylamino)tungsten, bis(2,2,6,6-tetramethyl-3,5-heptanedionato)strontium, and combinations thereof.

More preferably, the process chemicals are selected from the group consisting of tungsten pentachloride, dicobalt hexacarbonyl tert-butylacetylene (CCTBA), tantalum pentachloride, tungsten hexachloride, molybdenum pentachloride, pentakis(dimethylamino)tantalum, and combinations thereof.

While the principles of the invention have been described above in connection with preferred embodiments, it is to be clearly understood that this description is made only by way of examples and not as a limitation of the scope of the invention.

EXAMPLES

Example 1

Modeling tests were conducted to calculate the sublimation rate from tungsten pentachloride (WCl$_5$) precursor delivered from the container shown in FIG. 1, where carrier gas was introduced from cross type flow distributor with 12 jets having a diameter of 0.036".

The cross pipes had an inner diameter of 0.18 inch. The container had an inner diameter of 5.6 inches (14.224 cm).

The modeling was done for two precursor loading levels. At high loading level (5 Kg chemical loading), the distance between the cross bottom ridge and solid load (precursor)

surface was 0.49 inch. At low loading level (1 Kg chemical loading, 20% of original fill height), the distance was 5.50 inch.

3D fluid flow and species transport calculation have been used with commercial Computational Fluid Dynamics (CFD) software Fluent™.

Modeling used the assumption that sublimation occurs on the load surface. Sublimation rate was modeled as linearly proportional to the difference between local chemical vapor concentration in the gas phase near the load surface and the saturated chemical vapor concentration, assuming a saturated layer of chemical vapor exists at the load surface.

Local sublimation rate=Coeffx(Mass Fraction in gas phase−Saturated Mass Fraction)

Where sublimation rate is in unit of $kg/m^2s$.

For the container of the invention filled with tungsten pentachloride, it is found that Local sublimation rate $(kg/m^2s))=0.0361 \times$(Mass Fraction[$WCl_5$]−0.3177);

where 0.3177 was the saturated mass fraction of tungsten pentachloride at the container temperature 150° C. and pressure 105 Torr. The coefficient value of 0.0361 $kg/m^2s$ was calibrated with experimental data from the container of this invention filled with 780 g of tungsten pentachloride. Since there is a sublimation rate distribution at the load surface, overall sublimation rate was an integrated value over the entire load surface.

At a container temperature 150° C., 105 Torr container pressure with an inert carrier flow of 1000 sccm, sublimation rates were calculated to be 3.4e-4 $kg/m^2s$ at low load level (or low container fill level) and 2.26 e-4 $kg/m^2s$ at high load level (or high container fill level).

The container offered an unexpected result: a better sublimation rate at lower load level.

Example 2

Similar modeling tests were conducted to calculate the sublimation rate from Tantalum pentachloride ($TaCl_5$) precursor delivered from the container shown in FIG. 3, where carrier gas was introduced from a showerhead type flow distributor. Shower head type flow distributor had 33 jets, each jet has a diameter of 0.01 inch.

The showerhead flow distributor had a cross-section area of 13.46 square inches, equal to 56% of the container internal cross-sectional area.

At high loading level the distance between the shower head bottom side and the solid surface was 2.35 inch. At low loading surface the distance was 3.53 inch.

3D fluid flow and species transport calculation have been used with commercial Computational Fluid Dynamics (CFD) software Fluent™.

On the load surface, sublimation occurs. Sublimation rate was modeled as linearly proportional to the difference between local chemical vapor concentration in the gas phase near the load surface and the saturated chemical vapor concentration, assuming a saturated layer of chemical vapor exists at the load surface. That is, Local sublimation rate $(kg/m^2s)$=Coeffx(Mass Fraction in gas phase−Saturated Mass Fraction)

For the container of the invention filled with tantalum pentachloride, it was found that Local sublimation rate $(kg/m^2s)=0.0358 \times$(Mass Fraction[$TaCl_5$]−0.7382)

where 0.7382 is the saturated mass fraction of $TaCl_5$ at the container temperature 150° C. and pressure 105 Torr. Same coefficient value as Example 1 was used.

At a container temperature of 150° C., and 105 Torr with an inert carrier flow of 1000 sccm, sublimation rates were calculated to be 2.14e-3 $kg/m^2s$ at low load level and 2.20e-3 $kg/m^2s$ at high load level. The sublimation rate at low load level was reduced by <3%.

The showerhead design offered higher overall sublimation rate (stream leaving the chamber is near saturated) and smaller variation with the load level change.

The showerhead design uses smaller holes, 0.01 inch, and thus stronger jets to promote the mass transfer near the load surface. It also gives more uniform sublimation rate distribution. Therefore, this design has higher overall sublimation rate (stream leaving the chamber is near saturated) and smaller variation with the load level change.

Example 3

A container was constructed in the shape of a cylinder, comprising a base, sidewall, a lid, and a crossbar shape flow distributor. An inlet tube passed through the lid to the crossbar shape flow distributor. The crossbar shape flow distributor had 12 jets distributed evenly on the bottom part of the crossbar, as shown in FIG. 1.

The container has an internal diameter 5.6" with 2.5 L loading capacity (equivalent to >5 kg of tungsten pentachloride loading capacity). The cross pipes had an inner diameter of 4.0 inch.

The container also contained an outlet port in the lid for removing the carrier gas after it contacts the precursor material. The outlet stream passed through a cold glass trap to collect the evaporated precursor material and then to a vacuum pump. A vacuum control valve maintained a constant pressure in the container.

The container was filled with 780 g of tungsten pentachloride ($WCl_5$). The container was placed inside an oven heated to 190° C. on an aluminum plate maintained at 180° C. This temperature gradient was maintained to avoid solid condensation on the separator.

During the tests, downstream pressure was maintained at 100 torr and a nitrogen carrier gas was introduced to the container for 5 min at 1000 sccm. Carrier gas was passed through cooled glass trap to condense tungsten pentachloride vapor delivered with carrier gas. 5.8 g of tungsten pentachloride was collected in the trap during 5 min delivery time, to provide delivery rate of 1.16 g/min or 1.93 $e^{-5}$ kg/s. The sublimation rate was $1.24e^{-3}$ $kg/m^2s$.

The experiment demonstrated that the container of the present invention provided high sublimation rate of tungsten pentachloride even at low container fill volume.

It has been demonstrated that the containers having a flow distributor designed in the present invention can maintain a high precursor delivery rate, or offer higher precursor delivery rate at low container fill level compare to precursor delivery rate at high container fill level.

Thus, the containers can obtain high utilization of precursor and can minimize the amount of precursor left in the container when it is taken out of service to be cleaned and refilled.

Example 4

A container was constructed in the shape of a cylinder, comprising a base, sidewall, a lid, and a showerhead flow distributor. An inlet tube passed through the lid to the showerhead flow distributor. The showerhead flow distributor was tubular in cross-section and contained 33 holes each with a diameter of 0.01 inches evenly spaced around the bottom surface of the distributor and oriented to direct gas flow at 90° to the container lid, as shown in FIG. 3.

The showerhead flow distributor had a cross-section area of 13.46 square inches, equal to 69% of the container internal cross-sectional area.

The container also contained an outlet port in the lid for removing the carrier gas after it contacts the precursor material. The outlet stream passed through a cold trap to collect the evaporated precursor material and then to a vacuum pump. A vacuum control valve maintained a constant pressure in the container.

The container was filled with a liquid to a level equal to 50% of the maximum design fill level. The liquid material possessed the same vapor pressure as an alkyl metal carbonyl precursor. The jets of the showerhead flow distributor were 2.68 inches from the surface of the liquid.

Carrier gas was flowed through the flow distributor at a rate of 600 standard cubic centimeters per minute (sccm). The average container temperature was 18° C. and the pressure in the container was 35.3 Torr absolute. The vapor pressure of the liquid was 0.407 Torr absolute. The carrier gas was observed to impinge on the liquid surface uniformly on the area below the flow distributor. The carrier gas flow was maintained for 4 hours. After stopping the carrier flow, the precursor liquid collected in the cold trap was measured to be 7.775 grams, indicating that the outlet stream was fully saturated with precursor and achieved the maximum possible delivery rate for the tested conditions.

Example 5

A container was constructed in the shape of a cylinder, comprising a base, sidewall, a lid and a showerhead flow distributor. An inlet tube passed through the lid to the showerhead flow distributor. The showerhead flow distributor was tubular in cross-section and contained 33 holes each with a diameter of 0.01 inches evenly spaced around the bottom surface of the distributor and oriented to direct gas flow at 90° to the container lid, as shown in FIG. 3.

The showerhead flow distributor had a cross-section area of 13.46 square inches, equal to 56% of the container internal cross-sectional area.

The container also contained an outlet port in the lid for removing the carrier gas after it contacts the precursor material. The outlet stream passed through a cold trap to collect the evaporated precursor material and then to a vacuum pump. A vacuum control valve maintained a constant pressure in the container.

The container was filled with 700 g of solid tungsten pentachloride. The jets of the showerhead flow distributor were approximately 6.7 inches from the surface of the solid. Container bottom was heated to 170° C., container lid was heated to 180° C. and container valve manifold was heated to 190° C. This temperature gradient was maintained to avoid solid condensation on the separator and container lid. During the tests, downstream pressure was maintained at 150 torr and a nitrogen carrier gas was introduced to the container at 1000 sccm. Tungsten pentachloride delivery rate was measured using calibrated mass flow meter and was 0.35 g/min or $0.6\ e^{-5}$ kg/s. The sublimation rate was $3.78e^{-4}$ kg/m$^2$s.

The example suggests that using this container design higher delivery rate of tungsten pentachloride can be achieved even at low container fill level.

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

In the claims, letters may be used to identify claimed method steps (e.g. a, b, and c). These letters are used to aid in referring to the method steps and are not intended to indicate the order in which claimed steps are performed, unless and only to the extent that such order is specifically recited in the claims.

The invention claimed is:

1. A container for delivering a chemical precursor to a process tool, comprising:
    a sidewall;
    a base,
    a lid having a flat surface,
    an inlet tube,
    a hollow flow distributor comprising a plurality of small openings as jets, and
    an outlet passing through the lid;
    wherein
        the inlet tube passes through the lid and extended into the flow distributor, and is in fluid communication with the flow distributor,
        the jets are facing the base at an angle ranging from 60 to 90 degrees to the lid,
        each jet has an equivalent diameter ranging from 0.01 inches (0.025 cm) to 0.25 inches (0.64 cm); and
        the hollow flow distributor has hollow bars and a hollow showerhead, the hollow showerhead is centered in the hollow flow distributor with the hollow bars extended from the hollow showerhead parallel to the lid, the hollow showerhead is in fluid communication with the hollow bars.

2. The container of claim 1, wherein the container has a shape selected from the group consisting of cylindrical, rectangular cuboid, right cuboid, rectangular box, rectangular hexahedron, right rectangular prism, rectangular parallelepiped, and combinations thereof; and the hollow flow distributor has a cross section shape selected from the group consisting of tubular, circular, square, rectangular, and combinations thereof.

3. The container of claim 1, wherein the hollow showerhead has a cross section shape selected from the group consisting of tubular, circular, square, rectangular, and combinations thereof.

4. The container of claim 1, wherein the hollow bars have an inner equivalent diameter ranging from ⅛" to 1" and each jet on the hollow bars has an equivalent diameter ranging from 0.01 inches (0.025 cm) to 0.05 inches (0.125 cm).

5. The container of claim 1, wherein the hollow flow distributor has 2 to 16 hollow bars having an inner equivalent diameter ranging from ⅛" to 1" and sealed on the sides, and each jet on the hollow bars has an equivalent diameter ranging from 0.01 inches (0.025 cm) to 0.05 inches (0.125 cm).

6. The container of claim 1, wherein the hollow showerhead structure having a height of ⅛" to 1" with cross section area parallel to the lid ranging from 30% to 90% of cross section area of the container parallel to the lid, and each jet on the hollow showerhead has an equivalent diameter ranging from 0.01 inches (0.025 cm) to 0.05 inches (0.125 cm).

7. The container of claim 1, wherein the hollow showerhead has a height of ⅛" to 1", the hollow bars have an inner equivalent diameter ranging from ⅛" to 1" and are sealed on the sides, and each jet on the flow distributor has an equivalent diameter ranging from 0.01 inches (0.025 cm) to 0.05 inches (0.125 cm).

8. A system for delivering a chemical precursor to a process tool, comprising:
the chemical precursor selected from the group consisting of metal halides, metal β-diketonates, metal β-diketoesterates, metal β-ketoiminates, metal β-diiminates, metal alkyls, metal carbonyls, alkyl metal carbonyls, metal cyclopentadienyls, metal cyclopentadienyls carbonyls, metal pyrrolyls, metal imidazolyls, metal amidinates, metal alkoxides, and combinations thereof; wherein
the metal is selected from the group consisting of Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te, Cr, Mo Ta, and W;
a container containing the chemical precursor; comprising:
sidewall,
a base,
a lid having a flat surface,
an inlet tube,
a hollow flow distributor comprising a plurality of small openings as jets, and
an outlet passing through the lid;
wherein
the inlet tube passes through the lid and extended into the flow distributor, and is in fluid communication with the flow distributor,
the jets are facing the base at an angle ranging from 60 to 90 degrees to the lid,
tip of each jet is located with a distance of greater or equal to 0.5 inches from the chemical precursor the jet is facing,
each jet has an equivalent diameter ranging from 0.01 inches (0.025 cm) to 0.25 inches (0.64 cm); and
the hollow flow distributor has hollow bars and a hollow showerhead, the hollow showerhead is centered in the hollow flow distributor with the hollow bars extended from the hollow showerhead parallel to the lid, the hollow showerhead is in fluid communication with the hollow bars.

9. The system of claim 8, wherein the chemical precursor is selected from the group consisting of tungsten hexachloride, tungsten pentachloride, tantalum pentachloride, molybdenum pentachloride, hafnium tetrachloride, zirconium tetrachloride, dicobalt hexacarbonyl tert-butylacetylene (CCTBA), cyclopentadienyltungsten tricarbonyl hydride (CpW(CO)₃H)), bis(isopropylcyclopentadienyl) tungsten dihydride (iPrCp)₂WH₂, bis(alkylcyclopentadienyl) tungsten dihydride (RCp)WH₂, Ni(II)N,N'-di-tertiary-butylamidinate (Ni(II)(tBu-AMD)₂), Ni(II)N,N'-di-isopropylamidinate(Ni(II)(iPr-AMD)₂), Ni(II)N,N'-di-ethylamidinate(Ni(II)(Et-AMD)₂), Ni(II)N,N'-di-methylamidinate(Ni(II)(Me-AMD)₂), Co(II)N,N'-di-tertiary-butylamidinate(Co(II)(tBu-AMD)₂), Co(II)N,N'-di-isopropylamidinate(Co(II)(iPr-AMD)₂), tetrakis(dimethylamido)hafnium (TDMAH), tert-butylimino-tris(diethylamino)tantalum (TBTDET), tert-butylimido-tris(methylethylamino)tantalum (TBTEMT), pentakis(dimethylamino)tantalum, bis(tert-butylimino)bis (dimethylamino)tungsten (BTBMW), bis(tert-butylimino) bis(diethylamino)tungsten, bis(tert-butylimino)bis(ethylmethylamino)tungsten, bis(2,2,6,6-tetramethyl-3,5-heptanedionato)strontium, and combinations thereof.

10. The system of claim 8, wherein the chemical precursor is selected from the group consisting of tungsten pentachloride, dicobalt hexacarbonyl tert-butylacetylene (CCTBA), tantalum pentachloride, tungsten hexachloride, molybdenum pentachloride, pentakis(dimethylamino)tantalum, and combinations thereof.

11. The system of claim 8, wherein the container has a shape selected from the group consisting of cylindrical, rectangular cuboid, right cuboid, rectangular box, rectangular hexahedron, right rectangular prism, rectangular parallelepiped, and combinations thereof; and the hollow flow distributor has a cross section shape selected from the group consisting of tubular, square, rectangular, and combinations thereof.

12. The system of claim 8, wherein the hollow showerhead has a cross section shape selected from the group consisting of tubular, circular, square, rectangular, and combinations thereof.

13. The system of claim 8, wherein
the hollow flow distributor has connected hollow bars and extended parallel to the lid, wherein the hollow bars have an inner equivalent diameter ranging from ⅛" to 1", and sealed on the sides;
each jet on the hollow bars has an equivalent diameter ranging from 0.01 inches (0.025 cm) to 0.05 inches (0.125 cm); and
the chemical precursor is selected from the group consisting of tungsten pentachloride, dicobalt hexacarbonyl tert-butylacetylene (CCTBA), tantalum pentachloride, tungsten hexachloride, molybdenum pentachloride, pentakis(dimethylamino)tantalum, and combinations thereof.

14. The system of claim 8, wherein
the hollow showerhead having a height of ⅛" to 1" with a cross section shape selected from the group consisting of tubular, circular, square, rectangular, and combinations thereof;
the hollow showerhead has cross section area parallel to the lid ranging from 30% to 90% of cross section area of the container parallel to the lid, and
each jet on the hollow showerhead has an equivalent diameter ranging from 0.01 inches (0.025 cm) to 0.05 inches (0.125 cm), and
the chemical precursor is selected from the group consisting of tungsten pentachloride, dicobalt hexacarbonyl tert-butylacetylene (CCTBA), tantalum pentachloride, tungsten hexachloride, molybdenum pentachloride, pentakis(dimethylamino)tantalum, and combinations thereof.

15. The system of claim 8,
wherein the hollow showerhead having a height of ⅛" to 1", the hollow bars have an inner equivalent diameter ranging from ⅛" to 1" and are sealed on the sides, and each jet on the flow distributor has an equivalent diameter ranging from 0.01 inches (0.025 cm) to 0.05 inches (0.125 cm); and
the chemical precursor is selected from the group consisting of tungsten pentachloride, dicobalt hexacarbonyl tert-butylacetylene (CCTBA), tantalum pentachloride, tungsten hexachloride, molybdenum pentachloride, pentakis(dimethylamino)tantalum, and combinations thereof.

* * * * *